United States Patent [19]

Kurahashi et al.

[11] 4,328,263
[45] May 4, 1982

[54] METHOD OF MANUFACTURING SEMICONDUCTOR DEVICES USING LIFT-OFF TECHNIQUE

[75] Inventors: Toshio Kurahashi, Yokohama; Kazuo Tokitomo, Aizuwakamatsu; Tadashi Kiriseko, Kanagawa, all of Japan

[73] Assignee: Fujitsu Limited, Kanagawa, Japan

[21] Appl. No.: 172,823

[22] Filed: Jul. 28, 1980

[51] Int. Cl.³ .......................................... H01L 21/316
[52] U.S. Cl. .................... 427/93; 156/659.1; 427/88; 427/89; 427/95; 427/96; 427/259; 430/314
[58] Field of Search ............... 427/96, 259, 89, 88, 427/93, 95; 430/314; 156/659.1

[56] References Cited

U.S. PATENT DOCUMENTS

| 3,723,277 | 3/1973 | Schmiedecke | 204/192 |
| 4,029,562 | 6/1977 | Feng et al. | 204/192 |
| 4,123,565 | 10/1978 | Sumitomo | 427/96 |
| 4,181,755 | 1/1980 | Liu | 427/259 |

FOREIGN PATENT DOCUMENTS 2188304  1/1974  France .
1523677  9/1978  United Kingdom .

*Primary Examiner*—John D. Smith
*Attorney, Agent, or Firm*—Daniel Jay Tick

[57] ABSTRACT

In a method of manufacturing semiconductor devices, liquid glass is applied to the substrate of a semiconductor device to cover the upper surface of a film of photoresist formed on a conductor layer of the substrate and used as an etching mask for patterning the conductor layer. The substrate is baked at a sufficiently high temperature to harden the liquid glass and deform and shrink the photoresist film to expose the sides of such film. The photoresist film is removed. The hardened liquid glass on the photoresist film is simultaneously removed by lift off.

4 Claims, 6 Drawing Figures

METHOD OF MANUFACTURING SEMICONDUCTOR DEVICES USING LIFT-OFF TECHNIQUE

BACKGROUND OF THE INVENTION

The present inention relates to a method of manufacturing semiconductor devices. More particularly the invention relates to a method of forming a flat surface on a semiconductor device.

Semiconductor integrated circuits have been highly integrated, as seen in a large scale integrated circuit, or LSI, or a very large scale integrated circuit, or VLSI. Keeping pace therewith, conductive layers on the semiconductor substrate are arranged in multiple layers. As a result, conductive layers and insulating layers are alternately formed one on the other. Thus, as the layers increase from two layers to three, for example, differences in the levels of layers increase.

If a difference in the levels of layers is large, it frequently tends to cause problems, difficulties or troubles such as, for example, disconnection or short-circuit of conductors. Methods of minimizing such difference have been considered, and one effective method developed is, after formation of a conductor layer according to a predetermined pattern, to apply liquid glass to cover the entire surface of th layer. The liquid gloss is then hardened, and a layer of phospho-silicate glass, or PSG, is caused to adhere to the surface of hardened liquid glass.

The aforementioned glass is a liquid of which the main component is silicic acid made by hydrolysis of methylsilicate, which is hardened when treated at high temperature to form an insulator. The main component of the insulator is silicon dioxide, as will be understood from the following:

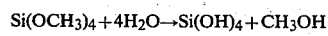
$$Si(OCH_3)_4 + 4H_2O \rightarrow Si(OH)_4 + CH_3OH$$

$CH_3OH$ evaporates when heated and

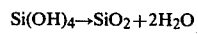
$$Si(OH)_4 \rightarrow SiO_2 + 2H_2O$$

in which $H_2O$ also evaporates.

A film of silicon dioxide obtained by hardening of the liquid glass has a thermal expansion coefficient greatly different from that of the conductive layer of aluminum, for example, so that said film is susceptible to cracking where it is in contact with the conductor layer. If the thickness of the film is great, there are many possibilities of cracks.

If there are such cracks, when a window is opened in order to provide a connection of terminal pads, a liquid etchant used to open the window permeates into the cracks. it is difficult to remove such etchant. This results in inconveniences such as corrosion of the conductor layers and falling off of the PSG layer. This is a defect fatal to the reliability of the semiconductor device. Cracks are usually formed at the interface of the conductor layer and the film of oxidized silicon.

Although there are some variations due to the difference of viscosity, a liquid such as the aforementioned liquid glass generally tends to spread and adhere thinly on upper surfaces of protrusions such as conductor layers and thickly in dented places between the conductor layers. In spite of this, great care is taken to spread the liquid thin so that the glass layer has a thickness in the order of 500 to 2000 Å to avoid formation of cracks. However, it is contrary to the anticipated object of maximum minimization of the difference of levels to so form a thin layer of liquid glass, and, as a matter of course, to do so has little effect in making the surface flat.

The principal object of the invention is to provide a method of manufacturing a semiconductor device which solves the problems and difficulties of the similar known methods.

An object of the invention is to provide a method of manufacturing a semiconductor device which minimizes the difference of levels in various layers formed on the surface of a semiconductor substrate by a method in which a hardened liquid glass is completely eliminated from the upper surface of a conductor layer, and the liquid glass is thickly formed in areas between the conductive layers.

Another object of the invention is to provide a method of manufacturing a semiconductor device which eliminates corrosion of conductors due to cracks formed when windows are opened to the conductors.

Still another object of the invention is to provide a method of manufacturing a semiconductor device which results in a much flatter surface of the semiconductor substrate than known methods.

BRIEF SUMMARY OF THE INVENTION

In accordance with the invention, a method of manufacturing a semiconductor device having a semiconductor substrate and a conductor layer formed on said substrate, comprises the steps of forming a film of photoresist on the conductor layer of the semiconductor device and using the film as an etching mask for patterning the semiconductor layer, applying liquid glass to the substrate to cover the upper surface of the photoresist film, baking the substrate at a sufficiently high temperature to harden the liquid glass and deform and shrink the photoresist film to expose the sides of the film, removing the photoresist film, and simultaneously removing by lift off the hardened liquid glass on the photoresist film.

The substrate with the liquid glass is baked at temperatures in the range of 170° to 200° C. to provide a hardened liquid glass film having a thickness in the order of several thousand Å.

The substrate is heated at temperatures in a range of 450° to 500° C. prior to removing the photoresist film.

A film of phospho-silicate glass is formed on the substrate to cover the conductor layer from which the liquid glass has been removed.

BRIEF DESCRIPTION OF THE DRAWINGS

In order that the invention may be readily carried into effect, it will now be described with reference to the accompanying drawings, wherein.

DETAILED DESCRIPTION OF A PREFERRED EMBODIMENT OF THE INVENTION

If cracks are formed in a film of silicon dioxide of a semiconductor device known in the art, shown in FIG.

Figure 1:
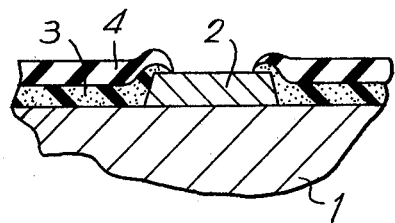
FIG. 1 is a cross-sectiozal view of part of a known semiconductor substrate of the art showing a conductor layer and an insulator layer and having problems, difficulties, or troubles unsolved by the known art.

1, when a window is opened to provide a connection of terminal pads, a liquid etchant used to open the window permeates into such cracks. It is difficult to remove such etchant, and inconveniences such as corrosion of the conductor layers and falling off of the PSG layer result. This is a defect fatal to the reliability of the device. The known semiconductor device of FIG. 1 has a substrate 1, a conductor layer 2 and a film 3 of silicon dioxide formed by hardening of liquid glass. A PSG layer 4 is formed on the substrate. Cracks form at the interface of the conductor layer and the film of oxidized silicon.

Figure 2A:
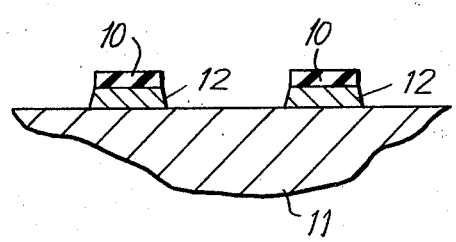
FIGS. 2A to 2E are cross-sectional views of part of a semiconductor device, illustrating successive steps of an embodiment of the method of the invention in manufacturing such device.

Successive steps of the method of the invention are shown in cross-section in FIGS. 2A to 2E. In FIG. 2A, a semiconductor substrate 11 is shown with a layer 12 of aluminum conductor having a thickness of approximately 1 $\mu$m patterned thereon. A film 10 of photoresist used as a mask for etching at the time of patterning of the conductor layer is left where it is without being removed.

Figure 2B:
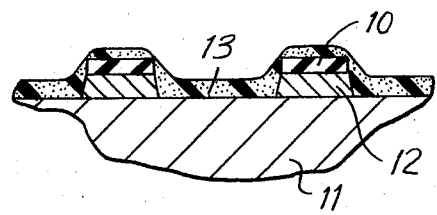

Next, as shown in FIG. 2B, a liquid glass 13 is applied via a conventional spinner, and the substrate 11 is then baked at a temperature within a range of 170° to 200° C. So much of the liquid glass is applied that, after baking, the thickness of a film of hardened liquid glass within a dent between conductor layers is in the order of several thousand Å.

Figure 2C:
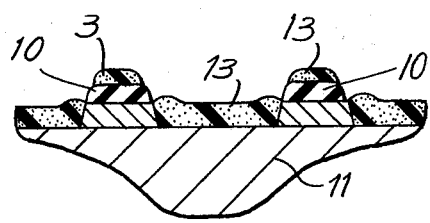

Thereafter, the substrate 11 is further baked at high temperatures within the range of 450° to 500° C. The photoresist film 10 is deformed and shrinks, as illustrated in FIG. 2C, with the hardened liquid glass 13 thereon dragged in to expose sides of the photoresist film.

Figure 2D:
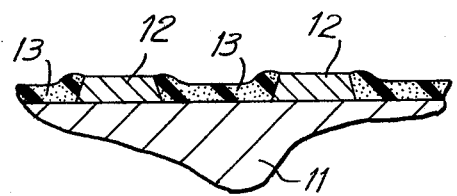

The photoresist film 10 is then removed by a solution containing organic solvent for separating the film, and, if any resist remains, it will be turned into ashes by oxygen plasma and removed. Thereupon, as shown in FIG. 2D, the part of the hardened liquid glass 13 on the photoresist film 10 formed on the upper surface of the aluminum conductor layer 12 is removed simultaneously with the removal of said photoresist film by lift off. The liquid glass is thus completely removed from the upper surface of the conduction layer. 1

Figure 2E:
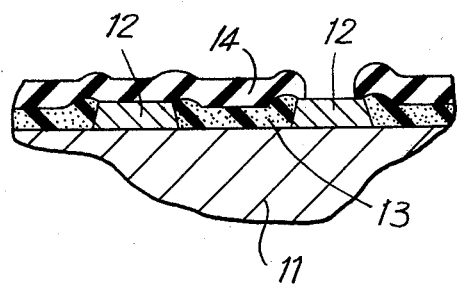

After the completion of these forming steps, a layer 14 of PSG of the thickness of approximately 1 $\mu$m is formed to cover what has been formed on the substrate, by conventional chemical vapor deposition. A window is opened at a terminal pad connection, as shown in FIG. 2E. There is then no liquid glass 13 on the aluminum conductor layer 12 and there are no cracks. Because of this, there will be no conductor corrosion difficulties or problems due to cracks formed at the time that windows are opened to provide contact of the second wiring conductor layer therewith and for bonding lead wires thereto.

Although one embodiment of the invention has been described, the invention is widely applicable for purposes other than that described, since a photoresist film may be formed on any part of a surface susceptible to cracking. Furthermore liquid glass on the upper surface of the photoresist film may be removed by lift off, permitting a thick film of liquid glass to be formed on the surface of material having a small coefficient of expansion, such as semiconductor substrate.

As described, it is possible to apply a thick film of liquid glass in accordance with the invention, so that the method of the invention makes the surface of a semiconductor substrate much flatter. That is, the method of the invention is a simple and ingenious method which facilitates the formation of multiple layer wiring conductors in a semiconductor integrated circuit device.

The method of the invention is therefore valuable when applied to integrated circuits of high packing density such as LSI, and is also effective in increasing the reliability of the product.

While the invention has been described by means of a specific example and in a specific embodiment, we do not wish to be limited thereto, for obvious modifications will occur to those skilled in the art without departing from the spirit and scope of the invention.

We claim:

1. A method of manufacturing a semiconductor device having a semiconductor substrate and a conductor layer formed on said substrate, said method comprising the steps of forming a film of photoresist on the conductor layer of said semiconductor device and using said film as an etching mask for patterning said conductor layer;

applying liquid glass to said substrate to cover the upper surface of said photoresist film;

baking said substrate at a sufficiently high temperature to harden the liquid glass and deform and shrink said photoresist film to expose the sides of said film;

removing said photoresist film; and simultaneously removing by lift off the hardened liquid glass on said photoresist film.

2. A method as claimed in claim 1, wherein said substrate with said liquid glass is baked at temperatures in the range of 170° to 200° C. to provide a hardened liquid glass film having a thickness in the order of several thousand Å.

3. A method as claimed in claim 1, further comprising the step of heating the substrate at temperatures in a range of 450° to 500° C. prior to removing said photoresist film.

4. A method as claimed in claim 1, further comprising the step of forming a film of phospho-silicate glass on said substrate to cover said conductor layer from which said liquid glass has been removed.

* * * * *

UNITED STATES PATENT AND TRADEMARK OFFICE
CERTIFICATE OF CORRECTION

PATENT NO. : 4,328,263
DATED : May 4, 1982
INVENTOR(S) : Toshio Kurahashi, Kazuo Tokitomo and Tadashi Kiriseko It is certified that error appears in the above-identified patent and that said Letters Patent are hereby corrected as shown below:

Title page, after line [22] insert the following lines:

[30]    Foreign Application Priority Data

July 31, 1979 [JP]    Japan ................ 54-97655

*Signed and Sealed this*

*Tenth* Day of *August 1982*

[SEAL]

*Attest:*

GERALD J. MOSSINGHOFF

*Attesting Officer*    *Commissioner of Patents and Trademarks*